(12) United States Patent
Westlund et al.

(10) Patent No.: US 9,851,902 B2
(45) Date of Patent: *Dec. 26, 2017

(54) SEARCHING MEMORY FOR A SEARCH KEY

(71) Applicants: Pär S Westlund, Värmdö (SE); Lars-Olof B Svensson, Stockholm (SE)

(72) Inventors: Pär S Westlund, Värmdö (SE); Lars-Olof B Svensson, Stockholm (SE)

(73) Assignee: Memobit Technologies AB, Stockholm (SE)

( * ) Notice: Subject to any disclaimer, the term of this patent is extended or adjusted under 35 U.S.C. 154(b) by 281 days.

This patent is subject to a terminal disclaimer.

(21) Appl. No.: 14/510,880

(22) Filed: Oct. 9, 2014

(65) Prior Publication Data

US 2016/0103611 A1   Apr. 14, 2016

(51) Int. Cl.
| | | |
|---|---|---|
| G06F 3/06 | (2006.01) | |
| G06F 17/30 | (2006.01) | |
| G06F 12/00 | (2006.01) | |
| G06F 13/00 | (2006.01) | |

(52) U.S. Cl.
CPC ............ *G06F 3/061* (2013.01); *G06F 3/0655* (2013.01); *G06F 3/0683* (2013.01); *G06F 12/00* (2013.01); *G06F 13/00* (2013.01); *G06F 17/3033* (2013.01); *G06F 17/30389* (2013.01)

(58) Field of Classification Search
CPC .......... G06F 17/3033; G06F 17/30389; G06F 3/061; G06F 3/0655; G06F 3/0683; G06F 12/00; G06F 13/00; H01L 51/001; H01L 51/0011; H01L 51/56

See application file for complete search history.

(56) References Cited

U.S. PATENT DOCUMENTS

| | | | |
|---|---|---|---|
| 6,697,276 B1 | 2/2004 | Periera et al. | |
| 6,700,809 B1* | 3/2004 | Ng .......................... | G11C 15/00 365/236 |
| 6,934,796 B1 | 8/2005 | Pereira et al. | |
| 7,193,874 B1* | 3/2007 | Pereira ................... | G11C 15/00 365/189.02 |
| 9,047,329 B1* | 6/2015 | Tyson ................. | G06F 17/3033 |

* cited by examiner

*Primary Examiner* — Ann J Lo
*Assistant Examiner* — Jane Wei
(74) *Attorney, Agent, or Firm* — Douglas L. Weller

(57) ABSTRACT

To produce output from a memory block, a first index is used to access a pointer, a mode select and a function select from a first memory. The pointer, the mode select and the function select are used to produce a second index. The pointer is used to produce the second index when the mode select is a first value. A function is used to produce the second index when the mode select is a second value. The function select identifies a function to be used to produce the second index. The second index is used to access output from a second memory.

20 Claims, 4 Drawing Sheets

SEARCHING MEMORY FOR A SEARCH KEY

BACKGROUND

Ternary content addressable memory (TCAM) devices are often used to support packet forwarding and classification operations in network switches and routers. A TCAM device can be instructed to compare a search value, typically formed from one or more fields within the header of an incoming packet, with entries within an associative storage array of the TCAM device. If the search value matches an entry, the TCAM device generates an index that corresponds to the location of the matching entry within a storage array, and asserts a match flag to signal the march. The storage array addressed by the index may be either within or separate from the TCAM device. The entry retrieved from the storage array includes, for example, routing or classification information for the packet.

A TCAM is typically organized as an array with multiple TCAM rows, where each row comprises multiple TCAM cells. When a search value is searched for in the TCAM it is simultaneously compared against all the values stored in the different rows. When all the TCAM cells in a row matches the search value, a row match signal for the row is generated. All match signals are connected to a match logic block. The match logic block generates a match address that corresponds to the match signal of the row.

A TCAM cell is typically implemented using two SRAM cells and comparison logic. The first SRAM cell contains a data bit and the second SRAM cell contains a mask bit. Each SRAM cell requires 6 transistors. The comparison logic requires 4 transistors. All together a TCAM cell requires 16 transistors to store one bit of data, which results in large die area per storage bit.

When a value is searched for in a TCAM device, all compare logic transistors in all TCAM cells are activated. This results in a large amount of required power and heat dissipation.

DESCRIPTION OF THE EMBODIMENT

Figure 1:
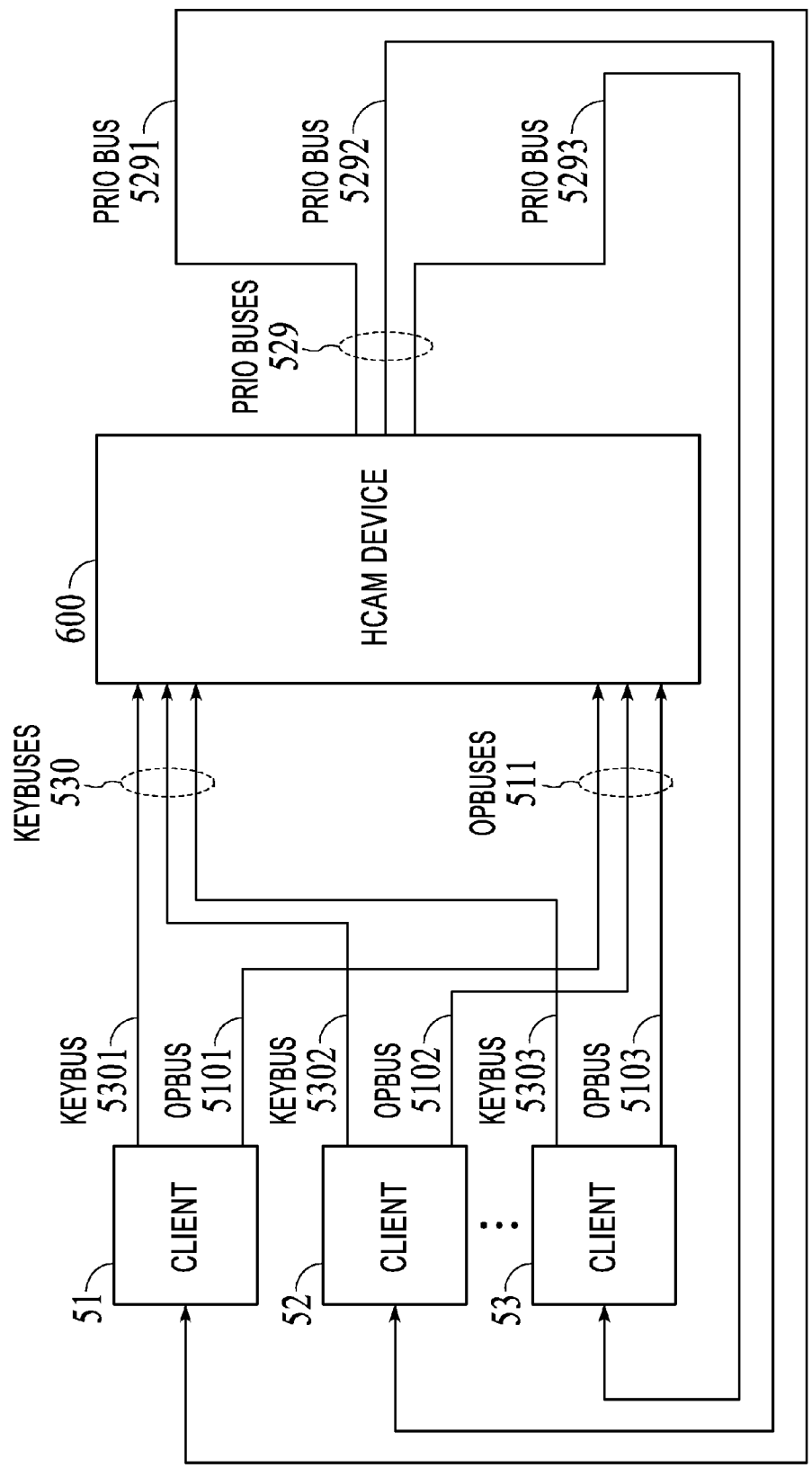
FIG. 1 is a simplified block diagram of a hash content addressable memory (HCAM) system used by multiple clients in accordance with an implementation.

FIG. 1 illustrates a hash content addressable memory (HCAM) device 600 used by multiple clients. In FIG. 1, multiple clients are illustrated by a client 51, a client 52 and a client 53. While FIG. 1 shows three clients, the number of clients will vary dependent upon design criteria, performance criteria and so on.

Each client interacts with HCAM device 600 through a key bus, an operation (op) bus and a priority (prio) bus dedicated to that client. As shown in FIG. 1, client 51 uses a key bus 5301, an op bus 5101 and a prio bus 5291. Client 52 uses a key bus 5302, an op bus 5102 and a prio bus 5292. Client 53 uses a key bus 5303, an op bus 5103 and a prio bus 5293.

On its dedicated op bus, each client places operations (instructions) for HCAM device 600. For example, an operation could be to search a specified table, or write to a specified table. On its dedicated key bus, the client places data associated to the operation. For example, if the operation is a write operation, the address and data for the write operation is placed on the key bus. If the operation is search a specified table, the search key to search for in the specified table is placed on the key bus. On the priority bus dedicated to the client, the responding HCAM device 600 places response information for the client.

Figure 2:
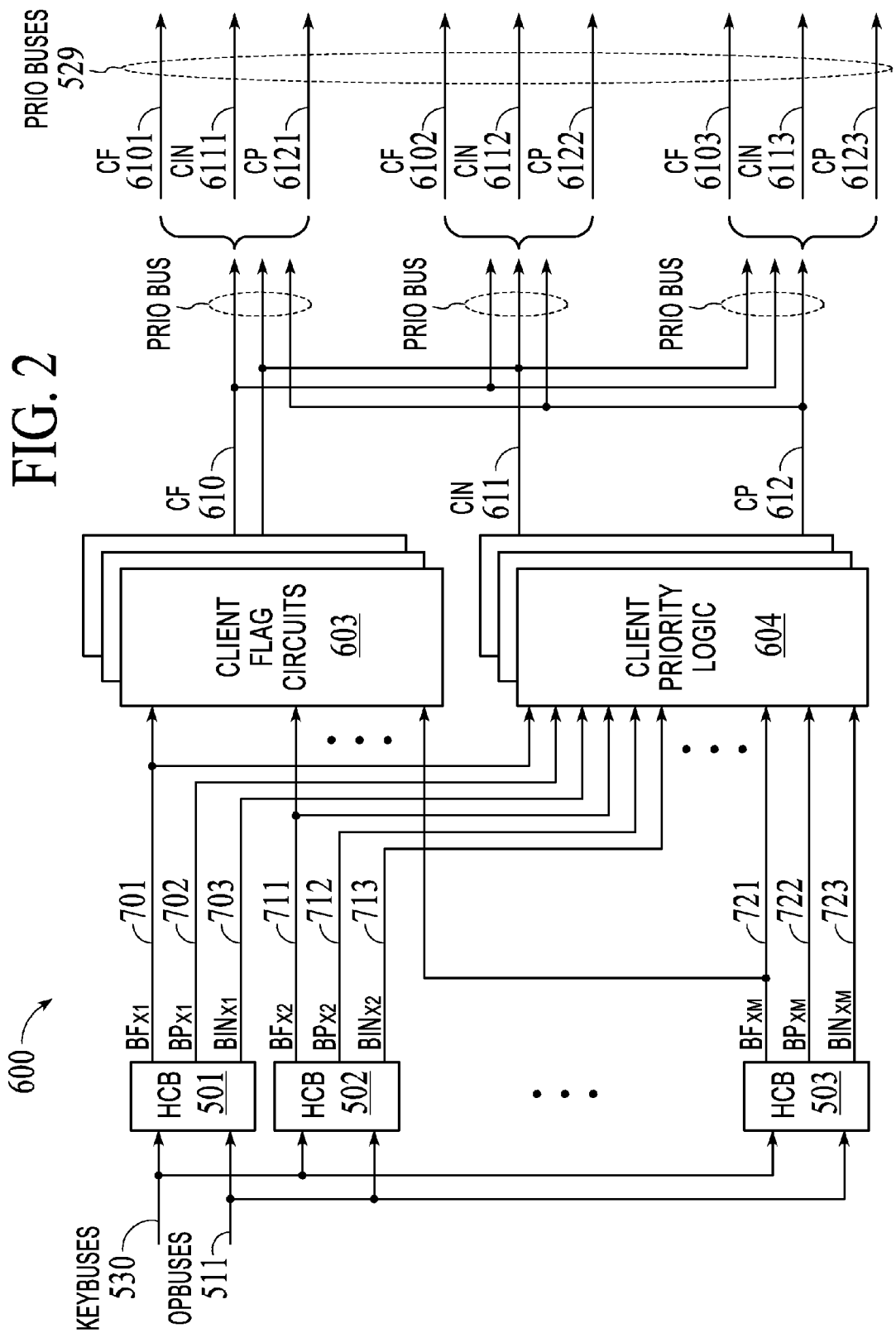
FIG. 2 is a simplified block diagram showing that the HCAM system of FIG. 1 has multiple HCAM blocks in accordance with an implementation.

FIG. 2, illustrates an implementation of HCAM device 600 that includes multiple hash CAM blocks, as illustrated by a hash CAM block (HCB) 501, an HCB 502 and an HCB 503. While FIG. 2 shows three hash CAM blocks, the number of hash CAM blocks will vary dependent upon design criteria, performance criteria and so on.

In a TCAM block an incoming search value is directly compared with each entry within an array of cells to locate a matching entry. In a HCAM block, however, a location in the memory storing an incoming search value is calculated using a function. The function uses the incoming search value as input. When populating the memory, the location of each search value stored within the memory is calculated using the function and the stored search value as input, so that, if the incoming search value matches a previously stored value, the calculated location will be the same. Accordingly, a match may be detected by comparing the incoming search value with the search value stored at the calculated location. If the stored search value and the incoming search value match, a match flag is asserted to indicate the match detection and a priority and index value are output.

Herein, by memory is meant a logical memory that can be implemented using one or more physical memory devices. For example, a memory or memory block can be implemented with multiple smaller physical memory subsystems, each physical memory subsystems, for example, having less memory width and/or smaller address space than the entire memory. Memories also, for example, can be divided into segments. Each segment can be, for example, stored in one or more physical memory subsystems.

A search table contains entries. Each entry contains a search value, a priority value and an index. For example, when a table entry is stored in HCAM device 600, the search value is defined by a mask part and a data part. The mask part is stored in a mask memory of a HCB and the data part is stored in a key memory of the HCB. Every search table entry is associated with a mask. The mask defines the masked and unmasked bits of the search value. Masked bits are wildcard/don't care bits and define the bits of the search value which should not be compared with an incoming search value. Many of the search table entries are associated with the same mask. That is they share the same definition of which bits are masked/unmasked.

A single HCB can only store table entries associated to the same mask for a particular table. That is the table entries stored in the HCB for a particular table, share all the same single mask which is written to the mask memory. In order to store entries in a particular table, where the entries are associated to multiple masks in HCAM device 600, the entries are distributed to multiple HCBs. For example if a table contain entries associated to four unique masks, the table entries are required to be stored in four different HCBs.

Each HCB stores the table entries associated to the mask, stored in the mask memory of the HCB.

When a search table operation is sent on the dedicated op bus and key bus of the client, all HCBs where table entries of the table are stored will be searched simultaneously and each HCB will present its search result on the prio bus. That is table entries associated to different masks will all be searched simultaneously. Only the HCB with the correct mask and data will present the final result on the prio bus. In case multiple HCB have successful mask and data match, the final result is decided by the table entry priority value.

In FIG. 2, the key buses for all the clients are represented by key buses 530. Likewise, the op buses for all the clients are represented by op buses 511. Likewise, the priority bus for all clients are represented in FIG. 2 by prio buses 529

Each of HCAM blocks (501-503) of CAM device 600 is connected to all of key buses 530 and op buses 511. Each of HCAM blocks (501-503) of CAM device 600 is configured to respond to a key bus, an op bus and a priority bus for only one client; however, multiple HCAM blocks can be configured to respond to the key bus, the op bus and the priority bus for that one client.

Each of HCAM blocks 501-503 produces a block flag, a block priority signal and a block index. During a search table operation, the block flag indicates searched for data was found within that HCAM. The block priority signal indicates the priority of the data from that HCAM. The block index is used to access a location of the matching entry within a storage array, which may be inside or outside HCAM device 600.

For example, HCAM block 501 produces block flags 701, block priority signals 702 and block indices 703. HCAM block 502 produces block flags 711, block priority signals 712 and block indices 713. HCAM block 503 produces block flags 721, block priority signals 722 and block indices 723. While each HCAM block has outputs for block flags, block priority signals and block indices for every priority bus, each HCAM block is enabled to produce block flags, block priority signals and block indices for only the priority bus of the selected client. The block flags, block priority signals and block indices for the other clients are disabled.

Client flag circuits 603 receive the block flags from all the HCAM blocks. Client flag circuits 603 are composed of a plurality of client flag blocks, one for each priority bus. Each client flag block receives from the HCAM blocks all the block flags for one priority bus and produces from them a single client flag for that one priority bus. When an HCAM block is configured for a particular client, HCAM block will perform a search based on values placed by the client on its associated key bus and op bus. If there is a match, the HCAM block will so signal the client via the block flag of the priority bus associated with the client.

Client priority circuits 604 receive the block priority signals and the block indices from all the HCAM blocks. Client priority circuits 604 is composed of a plurality of client priority blocks so that each client priority block produces a client priority and a client index for a single priority bus for a single client. When an HCAM block is enabled for a priority bus and there is a match, the client priority block for that priority bus will use the block priority signal and the block index from the HCAM with a match as its client priority and its client index, respectively.

During a search table operation initiated from an op bus dedicated to a client, each hash CAM block configured for that client's op bus will search concurrently to generate a block flag, a block priority value and a block index. The client flag circuit 603 asserts the client flag 610 for the priority bus corresponding to the client if any of its received block flag signals for that priority bus are asserted. The components of client flag 610 are connected as follows: client flag 6101 for client 51, client flag 6102 for client 52, client flag 6103 for client 53. The client priority logic 604 generates a client index 611 and a client priority value 612 according to the lowest priority block priority value for which the corresponding block flag is asserted. The client index 611 has one index per client: client index 6111 for client 51, client index 6112 for client 52, client index 6113 for client 53. The client priority bus 612 is connected as follows: priority bus 6121 to client 51, priority bus 6122 to client 52, priority bus 6123 to client 53.

Figure 3:
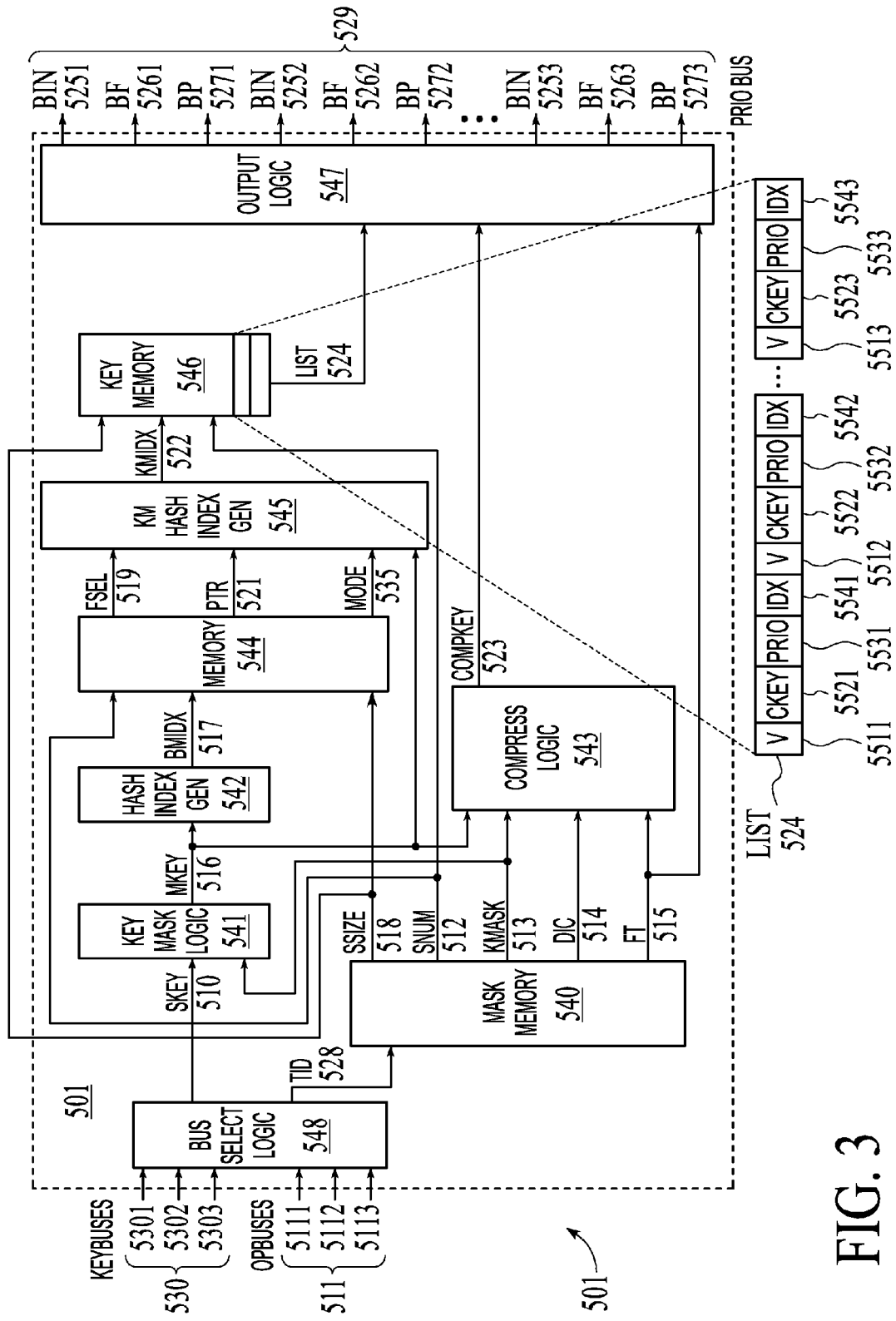
FIG. 3 is a simplified block diagram of a hash content addressable memory (HCAM) block in accordance with an implementation.

FIG. 3 shows a simplified block diagram of hash CAM block 501. Hash CAM block 501 includes bus select logic 548, a mask memory 540, key mask logic 541, a hash index generator 542, a memory 544, a key memory hash index generator 545, a key memory 546, compress logic 543 and output logic 547.

Bus select logic 548 is connected to all of operation buses 511 and all of key buses 530. Bus select logic 548 is configured to select one of the clients. This way each hash CAM block 501 can be assigned to a client. When a client is selected, it also means that all the buses associated to the client are selected. For example, if client 51 is selected, bus select logic 548 receives data from operation bus 5101 and key bus 5301. Each client uses its own buses to pass information to and from HCAM system 600. This way clients use dedicated hash CAM blocks even though they share the same pod of hash CAM blocks.

While FIG. 3 shows bus select logic 548 being connected to all of operation buses 511 and all of key buses 530, in alternative implementations bus select logic 548 may be connected to only a subset (one or more) of operation buses 511 and to only a subset (one or more) of key buses 530.

In FIG. 3, an op bus 5111, an op bus 5112 and an op bus 5113 are representative of individual op buses from op buses 511. Each op bus carries the operation code. For example the operation code could indicate a write operation or a search table operation. The operation code for a search table operation also includes a table identifier specifying the table to search. While FIG. 3 shows three key buses and three op buses, the number of buses is a design feature select by a system designer. For example, a typical system may support four clients thus requiring four op buses and four key buses.

In FIG. 3, a key bus 5301, a key bus 5302 and a key bus 5303 are representative of individual key buses from key buses 530. Each key bus is used to carry information associated to the operation (instruction) on the op bus. For example if the operation is a write operation the information includes 32 bit address and 32 bit data. If the operation is a search table operation the information includes a 320 bit wide search key. The width of each key bus corresponds to the width of the widest associated information required by an operation. For example if 320 bit wide searches are supported by HCAM device 600, the width of each key bus is 320 bits wide in order to support the search table operation for 320 bit wide keys.

In alternative embodiments the width of each key bus does not need to be fixed (hard-wired), instead the wires from the three key buses can be configured from a pool of key bus wires, for example key bus 5301 and key bus 5302 can be configured to use a 320 bit wide key bus and 5302 can be configured to use a 160 bit wide key bus from a pool of key bus wires containing 800 key bus wires. In this scenario a key bus width is associated to each client based on what operations the client is using. For example if the client requires 320 bit wide tables for search table operations, then the client requires a 320 bit wide key bus and the bus select logic in each HCAM block is not only configured to select one of the clients but also configured to use a 320 bit wide key bus.

In another embodiment the width of the key bus can also be narrowed if the information is passed over the key bus using multiple clock cycles. For example, a 320 bit wide key can be sent on a 160 bit wide key bus, if the 320 bits are divided over two clock cycles. Wire pooling and the use of multiple clock cycles to narrow the key buses are not limited to the key bus but also possible for the op bus and the prio bus.

While bus select logic 548 is connected to all of op buses 511 and all key buses 530, bus select logic 548 is preconfigured to read one of op buses 530 and a corresponding one of key buses 530 for a selected client. When a search operation is received on the selected operation bus from op buses 511, bus select logic 548 will forward a search key 510 from the selected key bus to key mask logic 541 and will extract from the selected op bus a table identifier 528 to forward to mask memory 540.

Mask memory 540 uses a table identifier 528 to find a matching mask entry within mask memory 540. Each mask entry within mask memory 540 includes table identifier 528, a key mask 513, a dictionary value 514, a segment size 518, a segment number 512 and a format indicator 515 that are used as described further below. If no mask entry in mask memory 540 contains a matching table identifier, a block select signal (not shown) is disabled. The block select signal is input to key mask logic 541, hash index generator 542, compress logic 543, memory 544, key memory hash index generator 545, key memory 546 and output logic 547 and effectively disables all these blocks to save power. In response to a disabled block signal, output logic 547 disables all the block flags. The block select signal is not shown in FIG. 3 to enhance readability.

If mask memory 540 contains a mask entry matching to table identifier 528, mask memory 540 will output a key mask 513, a dictionary value 514, a segment size 518, a segment number 512 and a format indicator 515 for the mask entry identified by table identifier 528. If the same table identifier value 528 is stored in multiple mask entries, the first matching mask entry is used.

When the HCB is configured, the software executing on a CPU, hereafter denoted the CPU, first assigns the HCB to a client using the bus select logic. Thereafter the CPU configures the HCB to support one or multiple tables used by the selected client. A single HCB can only store key entries associated to a single mask of a table (key entries for other masks are stored in other HCBs). The CPU writes the key mask 513, segment size 518, segment number 512, format value 515, dictionary value 514 and table identifier 528 to the mask entry. The CPU binds the table to the mask by writing the table identifier of the table in the mask entry. The key mask specifies the masked/unmasked portion of the search key and also the size of the search key. The size of the search key is specified by clearing the most significant bits of the key mask thus making the most significant bits of the search key masked (don't care). The segment size 518 and segment number 512 specifies the amount and location of memory used by the HCB for key entries using this mask (table). For example 25% of the HCB's memory can be used for entries using this mask. The format specifies how the key entries are stored. Key entries are stored in lists in the key memory. A list contains a number of equally sized key entries. Each key entry includes a priority, an index and a compressed key field. The format specifies the size of these three fields. All key entries using the same mask are stored using the same format. How key entries are compressed and stored in lists will be discussed further on.

Key mask logic 541 is select logic that combines key mask 513 and search key 510 to produce a masked key 516. For example, key mask logic 541 performs a bitwise AND of key mask 513 and search key 510 to set masked bits of search key 510 key to zero. For example, ones ("1") in key mask 513 are unmasked bits and zeroes ("0") in key mask 513 are masked (don't care/wildcard) bits. Key mask logic 541 and compress logic 543, together can operate as select logic to produce compression key 523.

Hash index generator 542 receives masked key 516 and produces a memory index 517. Hash index generator 542 uses a hash function to generate memory index 517. The hash function generates memory index values in the range zero to the size of memory 544. For example, if the size of memory 544 is 1024 entries, the memory index will be a value between zero and 1023. Memory index 517 is an index into memory 544.

Both memory index 517, segment size 518 and segment number 512 are used to access memory 544. The segment size and segment number are used to divide the memory between different tables identified by table identifier 528. The segment size specifies how much of the memory the table uses and is expressed as a fraction of the memory size. For example if memory 544 includes 1024 entries and the table requires 128 entries, then the segment size is set to ⅛. The segment number specifies which fraction of the memory the table uses, where the first segment has segment number zero. If the segment size for the table is set to ⅛ and the segment number is set to 6, it means that the table will use entries 768 to 895. The entry to be accessed in memory 544 is calculated using the following formula: entry=memory index*segment size+segment number*segment size*memory size. It should be noted that different tables (masks) can use different segment sizes within the same memory. For example one table can use segment size ½ and two other tables can use segment size ¼. If a single table uses all the memory, the segment size is set to 1/1 and segment number to zero. The ability to divide the memory between different tables allows masks with only a few entries to use the memory efficiently without consuming all the memory in a HCB. For example, a mask A of a table IPv4 can use 1/32 of the HCB for its 10 key entries. The remaining 31/32 of the HCB can be used by a mask K of table IPv6 for its 900 entries. This way the number of unused key entries will be very small.

An accessed memory location in memory 544 includes, for example a function select 519, a pointer 521, and a mode 535.

Key memory hash index generator 545 uses function select 519, pointer 521, and mode 535 to generate a key memory index 522.

Mode 535 specifies how key memory index 522 is calculated. In the implementation shown in FIG. 3, there are two modes specified by mode 535: pointer mode and function mode.

If the pointer mode is selected, pointer 521 is used to address key memory 546 and pointer 521 is copied to key memory index 522.

If the function mode is selected, key memory hash index generator 545 uses masked key 516 to generate key memory index 522. Function select 519 is used to specify which hash function key memory hash index generator 545 uses to generate key memory index 522.

Key memory index 522, segment size 518 and segment number 512 are used to access a fixed size list 524 from key memory 546. Key memory index values 522 are in the range zero to the size of key memory 546. For example, if the size of key memory 546 is 128 lists, the key memory index 522 will be a value between zero and 127. Segment size 518 and segment number 512 works the same way as previously described. Which list to access is calculated using the following formula:

List=key memory index*segment size+segment number*segment size*key memory size.

List 524 includes a number of entries of equal size. For example the list may include five entries of equal size.

Each entry includes a valid indication, a compressed key, a priority and an index. This is illustrated by a valid indication 5511, a compressed key 5521, a priority 5531 and an index 5541 for a first entry, a valid indication 5512, a compressed key 5522, a priority 5532 and an index 5542 for a second entry, and a valid indication 5513, a compressed key 5523, a priority 5533 and an index 5543 for a third entry.

The format of the list as specified by the format indicator 515 is set by the CPU when the mask entry is written as discussed above. Format indicator 515 specifies the width of the compressed key, priority and index fields of the entries stored in all lists used by the table in the HCB. For example, mask memory 540 is filled with two mask entries.

Table A: Format=3 indicating eight entries with a 32 bit compressed key, 8 bit priority and 8 bit index.

Table B: Format=4 indicating nine entries with a 28 bit key, 8 bit priority and 8 bit index.

Different tables require different entry formats since their stored entries are associated to different masks, the size of the table is different and so on. Furthermore even entries in the same table require different entry formats since a table contains multiple masks and different masks influence the size of the compressed key. That is the entry format used by a table is different in different HCBs depending on the key mask stored in the mask entry for the table.

When the CPU performs insertion or deletion in a HCB, it analyzes all the entries stored in the HCB. The CPU tries to compress the entries in such a way that it is possible to change to a more compact format. A more compact format is a format where the fixed size list can accommodate more entries. For example if all entries of a table in a HCB are possible to compress in such a way that they only require a 16 bits wide compressed key instead of a 20 bits wide compressed key, one more key entry can fit in every list and the format can be changed.

When the CPU populates a table within a HCB with entries, it is populating the entries in memory 544 according to segment size and segment number specified by the mask entry of the table. For example, table A has segment size set to ⅛ and segment number set to 6 and memory 544 contains 1024 entries, only entries 768 to 895 in memory 544 are populated. Similarly, the CPU uses the segment size and segment number to populate key memory 546. If key memory 546 contains 128 lists, the CPU will populate list 96-111.

Perfect hashing is a method used for a set of static keys. Static keys are keys which are all known beforehand. For example a language dictionary is a set of static keys where each key corresponds to a word in the language and since each word is known beforehand and the language will not change, shrink or expand, the keys are static. When using perfect hashing all static keys can be hashed to a unique position in memory without any collisions. Perfect hashing stores the keys in a key memory but also uses an intermediate memory called the bucket memory. First all keys are hashed to the bucket memory. Some buckets will end up empty or with a single key while other buckets contain multiple keys. For example some buckets contain one key while others can contain five keys. After all keys are hashed to buckets, the buckets are sorted in descending order based on how many keys they contain. That is, the first bucket in the list is the bucket containing the most keys and the last buckets are the ones containing one key. Buckets with zero keys are not interesting and not put in the list. Starting with the first bucket in the list, a second hash function is selected. This hash function hashes the keys in the first bucket to unoccupied locations in the key memory. One key is stored per location. The second hash function is iterated until all keys find an unoccupied location. Once the second hash function is found a hash function identifier is written to the bucket. Since the list of buckets is sorted, the buckets containing the most keys are placed first in the key memory while the key memory still contains many unoccupied locations. This makes sense since the difficulty to resolve bucket collisions depends on the number of collisions in the bucket but also the ratio between empty locations and total number of locations. The remaining buckets all containing a single key are now processed in such a way that instead of a hash function, a pointer is used to point out the location in the key memory. The pointer is written to the bucket together with an indication indicating that the pointer should be used instead of the second hash function. This will always be successful as long as the key memory contains more or the same amount of entries as the bucket memory. The ideas from perfect hashing is used for key insertion in the HCB. A key difference is however that the keys are not static. No keys are known beforehand and the number of keys is not known beforehand. Keys might get inserted or deleted at any time.

As already discussed, the format indicator stored in each mask entry specifies the size of the compressed key, priority and index fields of the key entries included in the lists associated to the mask entry. The compressed key has a maximum size. For example the maximum size is 128 bits. When the format indicator indicates a size of the compressed key which corresponds to the maximum size of the compressed key, the HCB will compress the masked key using signature compression. If the format indicator indicates a size of compressed key which is less than the maximum size, the HCB will compress the masked key using dictionary compression.

Figure 4:
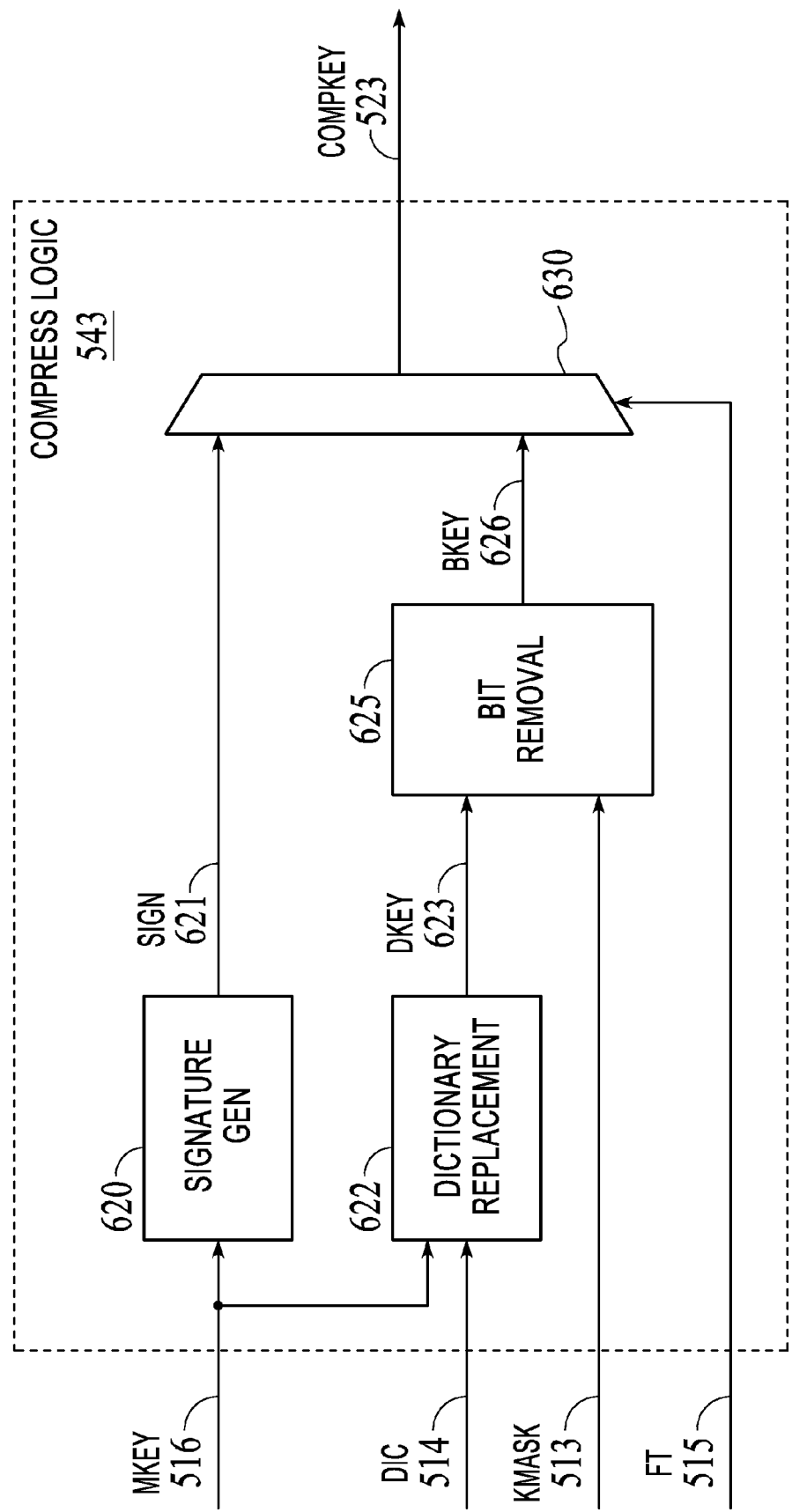
FIG. 4 is a simplified block diagram of a hash content addressable memory (HCAM) block in accordance with an implementation.

FIG. 4 shows an embodiment of compress logic 543. When processing a search operation, compress logic 543 receives mask key 516, key mask 513, dictionary value 514 and format indicator 515. Compress logic 543 produces a compressed key 523. Format indicator 515 specifies if signature or dictionary compression is used as compression method on the masked key.

In FIG. 4, a signature generator 620 is shown. Signature generator 620 uses a hash function such as a cryptographic hash function to create a signature 621 of masked key 516. Masked key 516 is compressed using the cryptographic hash function producing a signature corresponding to the size of the maximum compressed key size. For example, the signature is 128 bits wide.

Dictionary based compression is performed by dictionary replacement block 622, followed by bit removal block 625. Dictionary replacement block 622 compares nibbles in masked key 516 against a dictionary value 514. Dictionary value 514 specifies for a plurality of nibbles input values and their associated compressed encoding. Matching nibbles are substituted with the corresponding compressed encoding. Output of dictionary replacement block 622 is a dictionary-compressed key 623.

Bit removal block 625 performs compression by removing all wild card/don't care bits as specified by key mask 513. A bit-reduced key 626 is the output of bit removal block 625.

A selector 630 selects the compression type based on a value of format indicator 515. If dictionary compression is selected, only the least significant part of the masked key is processed. The least significant part could for example be the 128 least significant bits of the masked key. If the search key is even shorter than size of the least significant part, additional most significant bits are removed using the mask in the mask entry as previously discussed. If signature compression is selected the whole masked key is used by the signature compression process.

Output logic 547 (shown in FIG. 3) receives list 524, compressed key 523 and format indicator 515.

Format indicator 515 is used by output logic 547 to parse list 524. Format indicator 515 specifies the size of each compressed key (5511-5513), each priority field (5531-5533) and each index field (5541-5543) in list 524, the compression mode and also the number of entries in list 524. Based on this information about list 524, output logic 547 divides list 524 into entries and starts to analyze each entry one by one until a match is found between an entry in list 524 and compressed key 523.

In FIG. 3, priority buses are represented by a block index 5251, a block flag 5261 and a block priority 5271 for a first priority bus, a block index 5252, a block flag 5262 and a block priority 5272 for a second priority bus and a block index 5253, a block flag 5263 and a block priority 5273 for a third priority bus.

The HCB only uses one priority bus. The block flags on the other unused priority buses are always disabled.

For example, suppose the priority bus for the selected client utilizes block index 5252, block flag 5262 and block priority 5272. In response to a search, output logic 547 starts to analyze the first entry in list 524. If the valid field 551 is set and the compressed key 5521 matches the received compressed key 523, the entry has a match and the list search is terminated. The block flag 5262 is enabled, the priority 5531 and the index 5541 are copied respectively to block priority bus 5262 and the block index 5252.

If the list is searched to its end without a matching entry, the block flag 5262 is disabled.

While FIG. 3 shows format indicator 515 stored as part of entries within mask memory 540, format indicator 515 could instead be stored within list 524.

Further, while FIG. 3 shows compressed key 523 having been compressed by compress logic 543 before output logic 547 matches compressed key 523 to one of the compressed keys within list 524, the matching process can be handled by decompression instead. For example, the compressed keys within list 524 could all be decompressed and then compared with mask key 516 (or directly with search key 510 if there is no masking of search key 510) to obtain a search key match.

The foregoing discussion discloses and describes merely exemplary methods and embodiments. As will be understood by those familiar with the art, the disclosed subject matter may be embodied in other specific forms without departing from the spirit or characteristics thereof. Accordingly, the present disclosure is intended to be illustrative, but not limiting, of the scope of the invention, which is set forth in the following claims.

What is claimed is:

1. A hash content addressable memory comprising:
   a memory block that in response to a search operation performs an internal content addressable search to determine whether a search key resides within the memory block, the memory block comprising:
      a first memory that receives a first index and based on a value of the first index outputs a pointer, a mode select value and a function select value,
      a hash index generator that receives the pointer, the mode select value and the function select value and produces a second index, wherein when the mode select value is a first value, the hash index generator uses the pointer to produce the second index and when the mode select value is a second value, the hash index generator uses a hash function to produce the second index, the function select value identifying a hash function to be used to produce the second index, and
      a second memory that receives the second index and produces output based on a value of the second index.

2. A hash content addressable memory as in claim 1, wherein the memory block additionally comprises:
   key mask logic, that receives the search key and a key mask and based on values of the search key and the key mask produces a masked key which is used to generate the first index.

3. A hash content addressable memory as in claim 2, wherein the memory block additionally comprises a mask memory that receives a table identifier and based on a value of the table identifier produces a key mask used to generate the first index.

4. A hash content addressable memory as in claim 1 wherein the output produced by the second memory includes a list of entries.

5. A hash content addressable memory as in claim 1 wherein the first memory and the second memory also each receive a segment number indicating a memory segment in each of the first memory and the second memory, and each receive a segment size indicating a size of the memory segment in each of the first memory and the second memory.

6. A method for producing output from a memory block, the method implemented using hardware within the memory block and the method comprising:
   performing an internal content addressable search, in response to a search operation, to determine whether a search key resides within the memory block, including:
      using a first index to access a pointer, a mode select value and a function select value from a first memory,
      receiving the pointer, the mode select value and the function select value and producing a second index, including the following:
         using the pointer to produce the second index when the mode select value is a first value, and
         using a hash function to produce the second index when the mode select value is a second value, the function select value identifying a hash function to be used to produce the second index, and
      using the second index to access output from a second memory.

7. A method as in claim 6, wherein performing an internal content addressable search additionally comprises:

receiving a search key and a key mask and based on values of the search key and the key mask producing a masked key which is used to generate the first index.

8. A method as in claim 7, wherein performing an internal content addressable search additionally comprises:
receiving a table identifier and based on a value of the table identifier producing a key mask used to generate the first index.

9. A method as in claim 6 wherein the output produced by the second memory includes a list of entries.

10. A method as in claim 6 wherein a segment number indicating a memory segment of the second memory, and a segment size indicating a size of the memory segment, are also used to produce the second index.

11. A method as in claim 6 wherein a segment number indicating a memory segment of the second memory, and a segment size indicating a size of the memory segment are used along with the first index, to access the pointer, the mode select value and the function select value from the first memory.

12. A memory block that in response to a search operation performs an internal content addressable search to determine whether a search key resides within the memory block, the memory block comprising:
a first memory that receives a first index and based on a value of the first index outputs a pointer, a mode select value and a function select value;
an index generator that receives the pointer, the mode select value and the function select value and produces a second index, wherein when the mode select value is a first value, the index generator uses the pointer to produce the second index and when the mode select value is a second value, the index generator uses a hash function to produce the second index, the function select value identifying a hash function to be used to produce the second index; and
a second memory that receives the second index and produces output based on a value of the second index.

13. A memory block as in claim 12 wherein the first memory and the second memory also each receive a segment number indicating a memory segment of the second memory, and each receive a segment size indicating a size of the memory segment.

14. A memory block as in claim 12, additionally comprising:
key mask logic, that receives the search key and a key mask and based on values of the search key and the key mask produces a masked key which is used to generate the first index.

15. A memory block as in claim 14, wherein the memory block additionally comprises a mask memory that receives a table identifier and based on a value of the table identifier produces the key mask used to generate the first index.

16. A memory block as in claim 12 wherein the output produced by the second memory includes a list of entries.

17. A memory block as in claim 12 wherein, wherein the index generator additionally receives a masked key, the index generator additionally using the masked key when producing the second index.

18. A hash content addressable memory as in claim 1 wherein, wherein the index generator additionally receives a masked key, the index generator additionally using the masked key when producing the second index.

19. A hash content addressable memory as in claim 18, wherein the memory block additionally comprises:
key mask logic, that receives the search key and a key mask and based on values of the search key and the key mask produces the masked key, the masked key being additionally used to generate the first index.

20. A method as in claim 6, wherein method additionally comprises using a masked key when producing the second index.

* * * * *